(12) United States Patent
Berggren et al.

(10) Patent No.: US 10,175,308 B1
(45) Date of Patent: Jan. 8, 2019

(54) HIGH TEMPERATURE SUPERCONDUCTING QUANTUM INTERFERENCE DEVICE (HI-SQUID) METHOD

(71) Applicants: Susan Anne Elizabeth Berggren, San Diego, CA (US); Benjamin J. Taylor, Escondido, CA (US); Anna Leese de Escobar, Encinitas, CA (US)

(72) Inventors: Susan Anne Elizabeth Berggren, San Diego, CA (US); Benjamin J. Taylor, Escondido, CA (US); Anna Leese de Escobar, Encinitas, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/109,336

(22) Filed: Aug. 22, 2018

Related U.S. Application Data

(62) Division of application No. 15/148,062, filed on May 6, 2016, now Pat. No. 10,078,118.

(51) Int. Cl.
*H01L 39/00* (2006.01)
*G01R 33/00* (2006.01)
*G01R 33/035* (2006.01)

(52) U.S. Cl.
CPC ....... *G01R 33/0354* (2013.01); *G01R 33/035* (2013.01); *H01L 39/00* (2013.01)

(58) Field of Classification Search
CPC .......................... H01L 39/00; G01R 33/0354
See application file for complete search history.

(56) References Cited

U.S. PATENT DOCUMENTS

| | | | | |
|---|---|---|---|---|
| 5,625,290 A * | 4/1997 | You | ..................... | G01R 33/0358 257/31 |
| 6,476,413 B1 * | 11/2002 | Jia | ......................... | H01L 39/225 257/31 |
| 9,097,751 B1 * | 8/2015 | Longhini | ........... | G01R 33/0354 |
| 10,078,118 B2 * | 9/2018 | Berggren | ........... | G01R 33/0354 |
| 2007/0281861 A1 * | 12/2007 | Ishimaru | ............ | G01R 33/0354 505/100 |
| 2009/0233798 A1 * | 9/2009 | Maeda | ................. | G01R 33/035 505/190 |

(Continued)

*Primary Examiner* — Seahvosh Nikmanesh
(74) *Attorney, Agent, or Firm* — SSC Pacific Patent Office; Arthur K. Samora; Kyle Eppele

(57) ABSTRACT

A High Temperature Superconducting (HTS) Superconducting Quantum Interference Device and methods for fabrication can include at least one bi-Superconducting Quantum Interference Device. The bi-SQUID can include an HTS substrate that can be formed with a step edge. A superconducting loop of YBCO can be deposited on the step edge to establish two Josephson Junctions. A superconducting path that bi-sects the superconducting loop path can also be deposited onto the substrate. In some embodiments, the bisecting path can cross the step edge twice, and the bisecting path can be ion milled at one of the crossing points to round the bisecting path and thereby remove the fourth Josephson Junction at the other crossing point. In still other embodiments, the bisecting path can be completely on the upper shelf (or the lower shelf), and the bisecting path can be ion damaged, ion damaged, or particle damaged, to establish the third Josephson Junction.

7 Claims, 3 Drawing Sheets

(56) References Cited

U.S. PATENT DOCUMENTS

2014/0113828 A1* 4/2014 Gilbert .................. H01L 39/126
                                                        505/100
2015/0380631 A1* 12/2015 Taylor ................... H01L 39/025
                                                        257/31

* cited by examiner

HIGH TEMPERATURE SUPERCONDUCTING QUANTUM INTERFERENCE DEVICE (HI-SQUID) METHOD

CROSS REFERENCE TO RELATED APPLICATIONS

This application is a divisional application of, and claims the benefit of, U.S. patent application Ser. No. 15/148,062, filed May 6, 2016, by Susan Anne Elizabeth Berggren et al., entitled "High Temperature Superconducting Quantum Interference Device (HI-SQUID)". The contents of the '062 application are hereby incorporated by reference into this specification.

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing 09179.

FIELD OF THE INVENTION

The present invention pertains generally to Superconducting Quantum Interference Devices (SQUIDs). More particularly, the invention pertains to step edge bi-SQUIDs. The invention is particularly, but not exclusively, useful as a High Temperature Superconducting step edge bi-SQUID, which can allow for reduced size, weight and power (SWaP) of the associated cryopackaging of the bi-SQUID.

BACKGROUND OF THE INVENTION

Superconducting Quantum Interference Devices (SQUIDs) can comprise tiny loops of superconducting material in which Josephson Junctions are placed in the loop path. A Josephson Junction can be a region of material that provides a weak link between two fully super-conducting regions. Superconducting electrons can quantum mechanically tunnel across the Josephson Junction in a well-understood process.

The DC SQUID can have two symmetrical Josephson Junctions, and DC SQUIDs can typically sense extremely small magnetic fields. Non-uniforms arrays of DC SQUIDs and DC bi-SQUIDs, which are DC SQUIDs with an additional Josephson Junction bisecting the superconducting loop, have been modeled in different array designs and coupling schemes in the prior art, to determine their linearity and sensing capacities and have been fabricated in low temperature superconducting materials. A SQUID-based sensor can detect minute magnetic fields and can be decoupled from the size of the signal wavelength. As a result, the sensors can sense signals over a wide range of frequencies, from the direct current (DC) to the Gigahertz (GHz) range, but still be contained fully on a 1×1 cm chip.

SQUID arrays are now being explored for RF detection purposes. SQUID and bi-SQUID arrays that are designed for radio frequency (RF) detection throughout the high frequency (HF) to Ultra-High Frequency (UHF) range have been fabricated in low temperature superconducting (LTS) region of operation using Niobium (Nb) substrate material. For a field deployable system, high temperature superconductor (HTS) arrays are being explored due to the reduced size, weight and power (SWaP) of the cryopackaging. The resulting reduced-SWaP systems can more easily fit on a small platform. Some HTS SQUID arrays with non-uniform loop sizes have been fabricated and have demonstrated a desirable, similar single anti-peak feature as that present in the LTS SQUID arrays with non-uniform areas. But in order to increase the signal detection performance, a high temperature super-conductor (HTS) Bi-SQUID by utilizing step-edge junctions can now be desired.

In view of the above, it can be an object of the present invention to provide a step edge bi-SQUID and method for manufacture that allows for HTS operation. Another object of the present invention can be to provide a step edge HTS bi-SQUID (Hi-SQUID) that can require a reduced SWaP, when compared to Low Temperature Superconducting (LTS) variants. Yet another object of the present invention can be to provide a step edge Hi-SQUID and method for manufacture that incorporates step edge bi-SQUIDS without sacrificing linearity of anti-peak response. Another object of the present invention to provide a step edge Hi-SQUID and method for manufacture that can be consistently fabricated in a cost-effective manner.

SUMMARY OF THE INVENTION

A High Temperature Superconducting (HTS) Superconducting Quantum Interference Device (HI-SQUID) and methods for fabrication therefore can include at least one bi-Superconducting Quantum Interference Device (bi-SQUID). The bi-SQUID can include a substrate that can be formed with a step edge to establish an upper step and a lower step on the substrate. A superconducting loop can be deposited on said step edge to establish two Josephson Junctions at the step edge. The substrate can be made of an HTS material such as MgO. The superconducting loop can be made of a YBCO material.

To establish the third Josephson Junction (and the resultant bi-SQUID), a superconducting path can be deposited onto the substrate to establish a path that bi-sects the superconducting loop path. In some embodiments, the bisecting path can cross the step edge at least once, and the bisecting path can be ion milled where the bisecting path crosses the step edge the second time to round the bisecting path and thereby removing a fourth Josephson Junction. In still other embodiments, the bisecting path can be completely on the upper shelf (or the lower shelf), and the bisecting path can be ion damaged, ion milled, or particle beam damaged to established the third Josephson Junction.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

Figure 1:
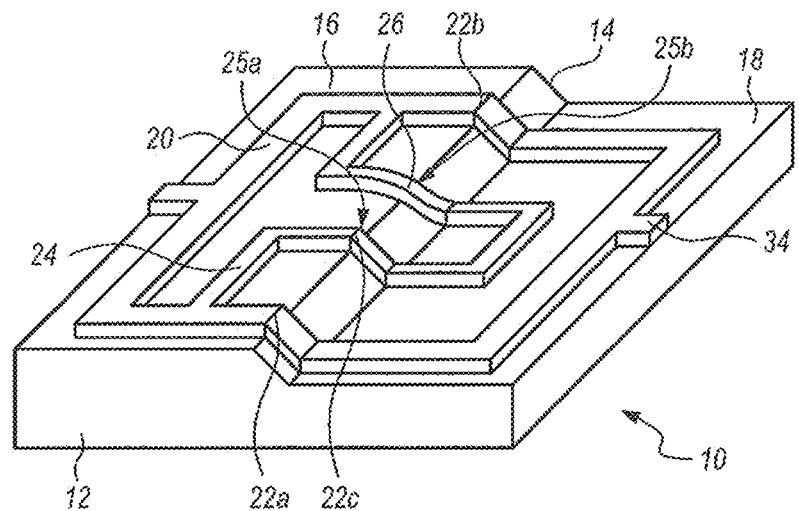
FIG. 1 is a side elevational view of the High Temperature Superconducting Quantum Interference Device (Hi-SQUID) of the present invention according to several embodiments.

Referring now to FIG. 1, a step edge high temperature superconducting (HTS) bi-Superconducting Quantum Interference device (bi-SQUID) is shown and is generally designated with reference character 10. As shown, step edge HTS bi-SQUID, or Hi-SQUID 10 can include a substrate 12 that is formed with a step edge 14. Step edge 14 can further defined an upper step 16 and a lower step 18 for hi-SQUID 10. A superconducting loop 20 can further placed on substrate 12 to define Josephson Junctions 22a, 22b at step edge 14. As shown in FIG. 1 this can result in a configuration wherein the Josephson Junctions 22 are oriented in a line across the substrate.

The placement of Josephson Junctions 22a,b can establish a DC SQUID configuration for superconducting loop 20. To form the third Josephson Junction 22c, a superconducting path 24 can be established, to bisect superconducting loop 20, as shown in FIG. 1. For the embodiments shown in FIG. 1, bisecting path 24 can be arranged so that it starts on upper step 16, crosses step edge 14 onto lower shelf 18, and then crosses step 14 back onto upper shelf 16 and merges back into superconducting loop 20. Stated differently bisecting path crosses step edge 14 twice. At one of the crossing points 25a, Josephson Junction 22c is established (which establishes the bi-SQUID). At the other crossing point 25b, the bisecting path can be rounded to form a curvature 26 in bisecting path 24, so that a Josephson Junction is not formed at curvature 26. One way to establish the curvature 26 is by ion milling. Other methodologies could be used. For example, if one of the crossing points is not smoothed out, then manipulation of Josephson Junction parameters (like junction width) could be used to obtain the bi-SQUID response with two bisecting Josephson Junctions in series.

Figure 2:
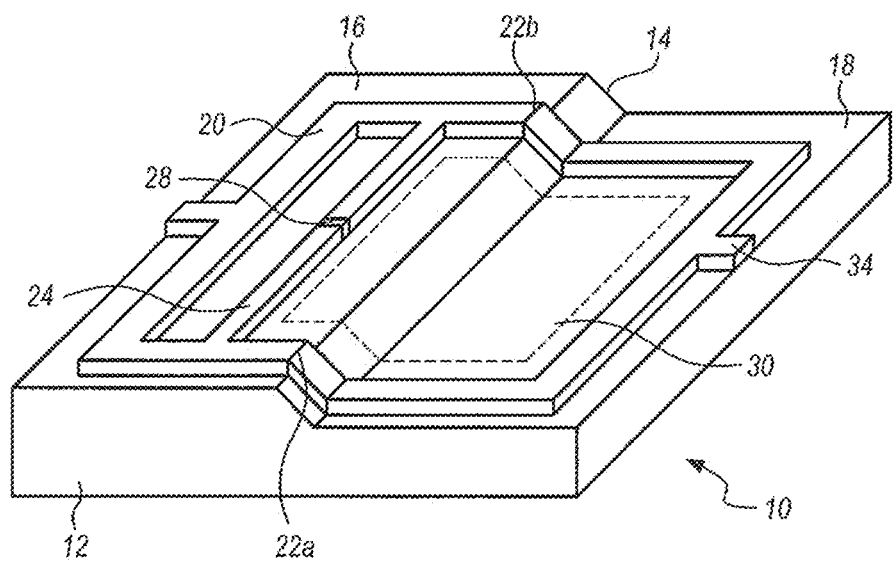
FIG. 2 is a side elevational view of alternative embodiments of the Hi-SQUID of FIG. 1.

Referring now to FIG. 2, other embodiment of the present invention can be shown. As seen in FIG. 2, other embodiments of Hi-SQUID 10 can include the same substrate 12, step edge 14, upper step 16 and lower step 18 as those embodiments of FIG. 1. Superconducting loop 20 can be placed on substrate 12 to form Josephson Junctions 22, and superconducting path 24 can bisect superconducting loop 20. However, for these embodiments, bisecting path does not cross step edge 14. Instead, bisecting path 24 extends across upper step 16 to bisect superconducting loop 20 (although not shown in the Figures, it should be appreciated that bisecting path 24 could also extend across lower step 18 to bisect superconducting loop 20 without crossing step edge 14). To form the third Josephson Junction, multiple methodologies could be used. One way to form Josephson Junction 28 can be by ion damaging bisecting path 24.

Because of the desired HTS region of operation for the Hi-SQUID 10, the selection of materials for substrate 12, superconducting loop 20 and bisecting path 24 (path 24 and loop 20 are typically, but not always made of the same material) can be important. In several embodiments, substrate 12 can be made of a manganese oxide (MgO) material, while superconducting loop 20 and bisecting path 24 can be made of a Yttrium barium copper oxide (YBCO) material. Other materials that establish operation on Hi-SQUID in the HTS regions could be used. The Hi-SQUID has been manufactured using a MgO substrate and a YBCO superconducting loop and bisecting path at the Commonwealth Scientific and Industrial Research Organisation (CSIRO) in Australia.

Figure 3:
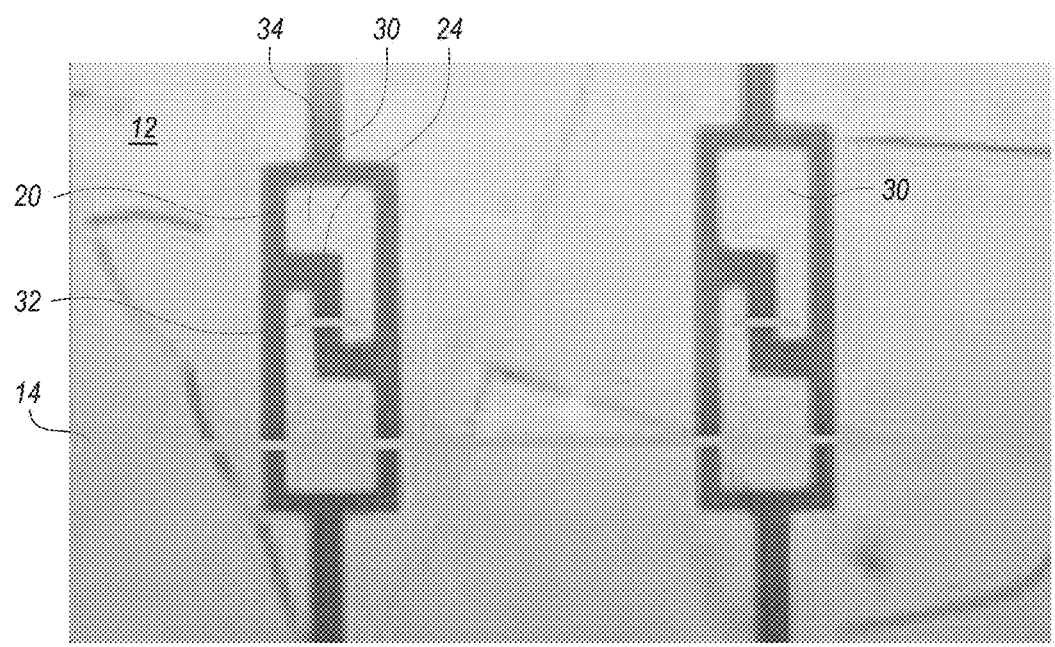
FIG. 3 is a color photograph of a top plan view of still other alternative embodiments of the Hi-SQUID of FIG. 1.

Referring now to FIG. 3, FIG. 3 is a color photograph of a step edge Hi-SQUID manufactured by CSIRO. FIG. 3 illustrates an embodiment wherein a superconducting loop 20 is placed on substrate 12, to establish Josephson Junctions across step edge 14. But for the embodiment illustrated in FIG. 3, a bisecting path step edge 32 can be formed in bisecting path 24 to form the third Josephson Junction (and thereby form the HTS bi-SQUID). Similarly, the width of Josephson junctions can be manipulated for the purposes.

It should be appreciated that the placement of bisecting path 24 to bisect superconducting loop 20 establishes sub loops 30, as shown in FIG. 2. The size and geometry of the subloops 30 can be manipulated to maintain the desired anti-peak response.

Figure 5:
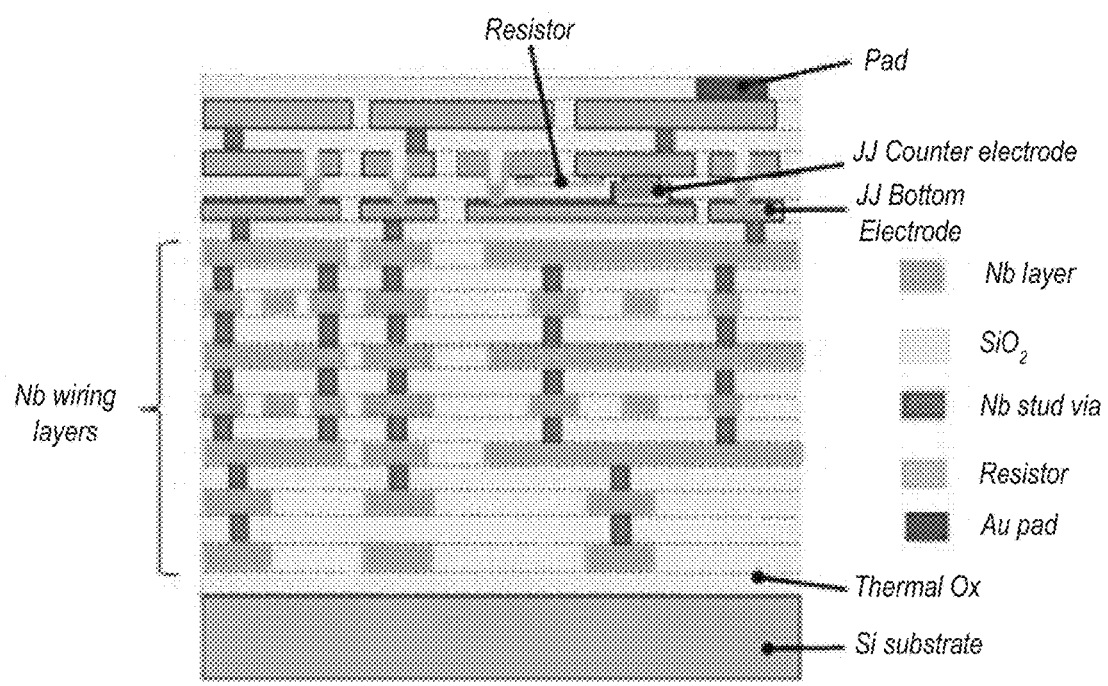

The above-described designs can be coupled together in different fashions (one way to couple Hi-SQUIDs via tab 34) to create arrays for improved signal detection and gain. The coupling can be in series, in parallel, and even in two dimensions. These arrays could have all the same loop sizes for an array of identical hi-SQUIDs or all different loop sizes to create an array with a single anti-peak feature around the zero magnetic field. Further, it should be appreciated that the systems and methods of the present invention can allow for a planar, single layer circuitry process, using YBCO as a ceramic two-dimensional superconductor. In the prior art (FIG. 5 is a representative prior art configuration), the superconducting circuitry is an LTS multi-layer process using Niobium as a metallic three-dimensional superconductor. Thus, the systems and methods of the present invention allow for a single layer HTS process using ceramic superconductors, which can be an advantage over the prior art.

Figure 4:
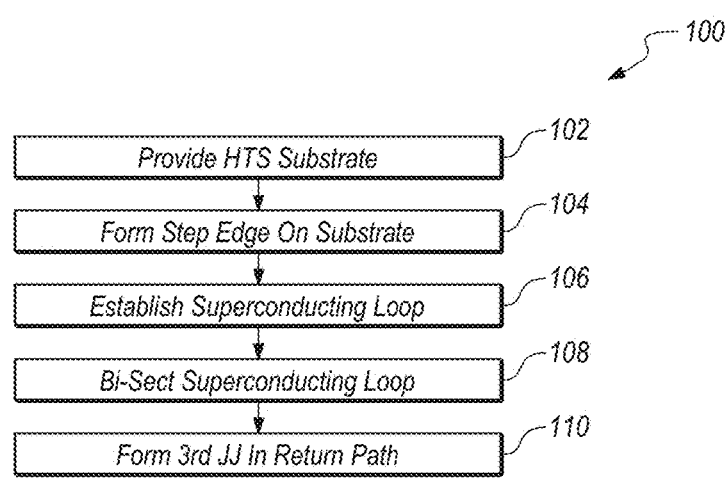
FIG. 4 is a block diagram, which illustrates steps that can be taken to accomplish the methods of the present invention according to several embodiments; and, FIG. 5 is a cross-sectional view of a prior art, multi-layer Low Temperature Superconducting Quantum Interference Device, with the multiple layers illustrated in color for ease or reference.

Referring now to FIG. 4, a block diagram 100 is illustrated, which can be used to describe the methods of the present invention according to several embodiments. As shown, the method depicted in FIG. 4 can include the initial step 102 of providing an HTS substrate. MgO can be used, but any other substrate that allows for operation in the HTS region could also be used. Next, a step edge 14 and be formed on substrate 12, as depicted by step 104. Certain embodiments (such as those shown in FIG. 3) may require that a second step edge 32 be formed.

Once the step edge is form, and as shown in FIG. 4, the methods can include the step 106 of establishing a superconducting loop 20. One way to this can be by placing a YBCO material on substrate 12 as described above. Once the superconducting loop is in place, and as shown in FIG. 4, the methods can include the step 108 of bisection the superconducting loop 20 with a bisecting path 24. Finally, and as shown by step 110 of FIG. 4, the methods can include the step of forming a third Josephson Junction 22 in the bisecting path. In cases where the bisecting path 24 does not cross the step edge 14, this can be accomplished by ion damaging the bisecting path as described above. In other instances where the bisecting path crosses the step edge twice (over and back at a first crossing point and a second crossing point), the bisecting path is milled at one of the points where it crosses the step edge (either crossing point would suffice) to form the curvature 26 described above, the Josephson Junction can then be established at the other point where the bisecting path 24 crosses the step edge 14.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for fabricating a bi-Superconducting Quantum Interference Device (bi-SQUID) comprising the steps of:
   A) providing a substrate;
   B) forming a step edge on said substrate;
   C) establishing a superconducting loop with two Josephson Junctions on said step edge;
   D) bisecting said superconducting loop with a superconductive bisecting path, so that said superconductive bisecting path crosses said step edge twice, at a first crossing point and a second crossing point; and,
   E) establishing a rounded region in said superconductive bisecting path at said one of said first crossing point and said second crossing point, to establish said bi-SQUID.

2. The method of claim 1 wherein said substrate is a High Temperature Superconductivity (HTS) material.

3. The method of claim 2, wherein said HTS material is MgO.

4. The method of claim 1, wherein said step C) is accomplished by depositing YBCO on said substrate.

5. The method of claim 1, further comprising the step of:
   F) forming a third Josephson Junction on said step edge at the other of said first crossing point and said second crossing point.

6. The method of claim 1, wherein said step B) establishes an upper step and a lower step, and further wherein step D) is accomplished by ion damaging a path on the upper region to establish a third Josephson Junction.

7. The method of claim 1, wherein said establishing step is accomplished by ion milling said rounded region at said one of said first crossing point and said second crossing point.

* * * * *

UNITED STATES PATENT AND TRADEMARK OFFICE
CERTIFICATE OF CORRECTION

PATENT NO.         : 10,175,308 B1
APPLICATION NO.    : 16/109336
DATED              : January 8, 2019
INVENTOR(S)        : Susan Anne Elizabeth Berggren, Benjamin J. Taylor and Anna Leese de Escobar It is certified that error appears in the above-identified patent and that said Letters Patent is hereby corrected as shown below:

In the Specification

In Column 1, Line 24, the number "09179" should read "109179"

Signed and Sealed this
Nineteenth Day of February, 2019

Andrei Iancu
*Director of the United States Patent and Trademark Office*